US012146714B2

United States Patent
Lin et al.

(10) Patent No.: US 12,146,714 B2
(45) Date of Patent: Nov. 19, 2024

(54) HEAT DISSIPATION DEVICE ASSEMBLY

(71) Applicant: ASIA VITAL COMPONENTS CO., LTD., New Taipei (TW)

(72) Inventors: Sheng-Huang Lin, New Taipei (TW); Yuan-Yi Li, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 241 days.

(21) Appl. No.: 18/064,290

(22) Filed: Dec. 12, 2022

(65) Prior Publication Data

US 2023/0243607 A1  Aug. 3, 2023

(30) Foreign Application Priority Data

Jan. 28, 2022  (TW) .................................. 111103919

(51) Int. Cl.
*F28F 21/08* (2006.01)
*F28D 15/02* (2006.01)
(Continued)

(52) U.S. Cl.
CPC ........ *F28F 21/084* (2013.01); *F28D 15/0275* (2013.01); *F28F 21/085* (2013.01);
(Continued)

(58) Field of Classification Search
CPC ....... F28D 15/0275; F28F 21/085; F28F 1/32; F28F 9/268; F28F 2275/06;
(Continued)

(56) References Cited

U.S. PATENT DOCUMENTS 5,651,414 A * 7/1997 Suzuki ............... H05K 7/20936
165/104.33
5,699,853 A * 12/1997 Goth ..................... H01L 23/427
165/185
(Continued)

FOREIGN PATENT DOCUMENTS

CN      100343611 C      10/2007
CN      100543973 C  *   9/2009
(Continued)

OTHER PUBLICATIONS

Search Report dated Jun. 4, 2024 issued by China National Intellectual Property Administration for counterpart application No. 2022101044798, 2 pages.
(Continued)

*Primary Examiner* — Ljiljana V. Ciric
(74) *Attorney, Agent, or Firm* — Bradley J. Thorson; DeWitt LLP (57) ABSTRACT

A heat dissipation device assembly includes an aluminum base seat, an aluminum radiating fin assembly and at least one U-shaped copper heat pipe, which is upright arranged or horizontally arranged. The aluminum base seat has at least one connection section. A copper embedding layer is disposed on the connection section. The aluminum radiating fin assembly is assembled and disposed on the aluminum base seat. The copper heat pipe has a heat dissipation section and a heat absorption section respectively connected on the aluminum radiating fin assembly and the connection section of the aluminum base seat. By means of the copper embedding layer, the aluminum base seat and the copper heat pipe can be directly welded and connected with each other without chemical nickel treatment.

8 Claims, 4 Drawing Sheets

(51) Int. Cl.
  *F28F 1/32*       (2006.01)
  *F28F 9/26*       (2006.01)
  *H01L 21/48*      (2006.01)
  *H01L 23/427*     (2006.01)
  *H05K 7/20*       (2006.01)

(52) U.S. Cl.
  CPC ........ *H01L 21/4882* (2013.01); *H01L 23/427* (2013.01); *H05K 7/20336* (2013.01); *H05K 7/20418* (2013.01); *F28F 1/32* (2013.01); *F28F 9/268* (2013.01); *F28F 2275/06* (2013.01)

(58) Field of Classification Search
  CPC ............ H05K 7/20336; H05K 7/20418; H01L 21/4882; H01L 23/427
  See application file for complete search history.

(56) References Cited

U.S. PATENT DOCUMENTS

| | | | | |
|---|---|---|---|---|
| 6,625,021 | B1* | 9/2003 | Lofland | H01L 23/427 361/720 |
| 6,830,098 | B1* | 12/2004 | Todd | F28D 15/0275 165/104.21 |
| 6,894,900 | B2* | 5/2005 | Malone | H01L 23/427 174/15.2 |
| 6,915,844 | B2* | 7/2005 | Chou | F28D 15/0275 257/E23.099 |
| 6,918,429 | B2* | 7/2005 | Lin | F28D 15/0275 165/185 |
| 6,978,829 | B1* | 12/2005 | Lin | H01L 23/4093 174/15.2 |
| 7,000,687 | B2* | 2/2006 | Ying | F28D 15/0275 174/15.2 |
| 7,025,125 | B2* | 4/2006 | Sheng | F28D 15/0233 165/80.4 |
| 7,036,566 | B1* | 5/2006 | Huang | H01L 23/427 257/714 |
| 7,093,648 | B1* | 8/2006 | Cheng | H01L 23/427 165/104.33 |
| 7,106,589 | B2* | 9/2006 | Kiley | F28F 3/06 361/709 |
| 7,143,819 | B2* | 12/2006 | Malone | F28D 15/0275 165/104.33 |
| 7,165,603 | B2* | 1/2007 | Mochizuki | F28D 15/02 165/104.21 |
| 7,188,663 | B2* | 3/2007 | Lin | H01L 23/427 165/104.33 |
| 7,370,693 | B2* | 5/2008 | Lin | F28D 15/0275 165/104.33 |
| 7,387,155 | B2* | 6/2008 | Chen | H01L 23/467 257/E23.099 |
| 7,455,102 | B2* | 11/2008 | Cheng | F28D 15/0275 257/E23.099 |
| 7,515,417 | B2* | 4/2009 | Lee | H01L 23/467 165/80.4 |
| 7,575,045 | B2* | 8/2009 | Sheng | F28D 15/0275 165/104.21 |
| 7,757,751 | B2* | 7/2010 | Zhou | F28D 15/0275 165/104.33 |
| 7,942,194 | B2* | 5/2011 | Mochizuki | H01L 23/427 165/104.21 |
| 7,967,059 | B2* | 6/2011 | Li | H01L 23/467 165/104.33 |
| 7,990,712 | B2* | 8/2011 | Fang | G06F 1/20 361/679.52 |
| 8,191,612 | B2* | 6/2012 | Huang | H01L 23/427 165/104.21 |
| 8,220,151 | B2* | 7/2012 | Yang | B23P 15/26 29/890.032 |
| 8,267,157 | B2* | 9/2012 | Qin | F28D 15/0275 165/104.33 |
| 8,322,403 | B2* | 12/2012 | Lin | F28D 15/0275 165/80.2 |
| 8,746,325 | B2* | 6/2014 | Huang | F28D 15/0233 165/80.2 |
| 8,806,748 | B2* | 8/2014 | Huang | F28F 9/013 29/890.038 |
| 10,108,237 | B1* | 10/2018 | Fu | F28D 15/0275 |
| 10,739,832 | B2* | 8/2020 | O'Connell | H01L 23/467 |
| 10,772,235 | B2* | 9/2020 | Wei | F28F 21/084 |
| 2001/0001981 | A1* | 5/2001 | Ueda | F28D 15/0275 174/16.3 |
| 2005/0098304 | A1* | 5/2005 | Lin | F28D 15/0275 165/104.33 |
| 2006/0278374 | A1* | 12/2006 | Hao | F28D 15/0266 257/E23.099 |
| 2007/0114009 | A1* | 5/2007 | Xia | F28D 15/0275 257/E23.103 |
| 2007/0217153 | A1* | 9/2007 | Lai | H01L 23/427 165/80.4 |
| 2008/0121371 | A1* | 5/2008 | Zhou | F28D 15/0275 257/E23.099 |
| 2008/0314556 | A1* | 12/2008 | Zhou | F28D 15/0266 165/104.33 |
| 2011/0265976 | A1* | 11/2011 | Li | H01L 23/3672 165/104.26 |
| 2012/0205084 | A1* | 8/2012 | Huang | H01L 23/427 165/181 |
| 2012/0222839 | A1* | 9/2012 | Huang | F28D 15/0275 165/104.26 |
| 2012/0273168 | A1* | 11/2012 | Peng | F28D 15/0275 165/104.26 |
| 2013/0340977 | A1* | 12/2013 | Singleton | F28D 15/02 165/104.11 |
| 2017/0102186 | A1* | 4/2017 | Huang | F28D 15/0275 |
| 2021/0398871 | A1* | 12/2021 | Eid | H01L 23/3736 |
| 2021/0410331 | A1* | 12/2021 | Eid | F28D 15/0275 |
| 2023/0243596 | A1* | 8/2023 | Lin | F28F 21/085 165/104.21 |
| 2023/0243607 | A1* | 8/2023 | Lin | H01L 23/427 165/104.21 |
| 2023/0243608 | A1* | 8/2023 | Lin | F28D 15/0275 165/104.21 |

FOREIGN PATENT DOCUMENTS

| | | | | |
|---|---|---|---|---|
| CN | 101896049 | A | | 11/2010 |
| CN | 102256470 | A | | 11/2011 |
| CN | 202485510 | U | | 10/2012 |
| CN | 106439519 | A | * | 2/2017 |
| CN | 216820489 | U | | 6/2022 |
| JP | 2007180353 | A | * | 7/2007 |
| JP | 3135914 | U | | 10/2007 |
| JP | 3208516 | U | * | 1/2017 |
| TW | 200725234 | A | | 7/2007 |
| TW | 201038911 | A | | 11/2010 |
| TW | 201723413 | A | | 7/2017 |
| TW | 201735052 | A | * | 10/2017 ............. B01J 35/00 |
| TW | M629048 | U | | 7/2022 |
| WO | WO-2014092057 | A1 | * | 6/2014 ......... F28D 15/0275 |

OTHER PUBLICATIONS

Search Report dated Nov. 7, 2022 issued by Taiwan Intellectual Property Office for counterpart application No. 111103919.

* cited by examiner

HEAT DISSIPATION DEVICE ASSEMBLY

This application claims the priority benefit of Taiwan patent application number 111103919 filed on Jan. 28, 2022.

BACKGROUND OF THE INVENTION

1. Field of the Invention

The present invention relates generally to a heat dissipation device assembly, and more particularly to a heat dissipation device assembly including an aluminum base seat and an aluminum radiating fin assembly. A copper embedding layer is disposed on a section of the aluminum base seat or the aluminum radiating fin assembly, which section is to be connected. By means of the copper embedding layer, the aluminum base seat can be respectively directly welded and connected with a copper heat pipe made of heterogeneous metal material or the aluminum radiating fin assembly made of the same material without chemical nickel treatment procedure.

2. Description of the Related Art

The conventional heat sink or heat dissipation device is generally made of copper and cooperative aluminum material. Copper has a property of high heat conductivity so that in the conventional heat sink or heat dissipation device, the heat dissipation base seat is often selectively made of copper material for conducting the heat generated by an execution unit (such as central processing unit, graphics processing unit or other transistor or other heat source) and dissipating the heat by heat exchange. However, in the case that the heat sink or the heat dissipation device is entirely made of copper material, the heat sink or the heat dissipation device will have a quite heavy weight and the cost is very high. Therefore, in the current manufacturing method, the components in direct contact with the heat source to absorb the heat of the heat source, (such as the heat conduction unit (heat conduction component, heat conduction body, heat conduction seat), copper plate, heat pipe, vapor chamber, etc.), are made of copper material, while the other components (such as fastening-type radiating fin assembly, heat sink or heat dissipation seat) are selectively made of relatively lightweight aluminum material at lower cost so as to reduce the weight and lower the cost.

For example, the conventional heat dissipation device generally includes an aluminum base seat, multiple copper heat pipes, a fastening-type aluminum radiating fin assembly and a copper plate. The fastening-type aluminum radiating fin assembly is composed of multiple radiating fins, which are fastened with each other. Each radiating fin has two folded edges each having an outward protruding fastening section. The fastening sections of the radiating fins are fastened with each other, whereby the two folded edges form the top face and bottom face of the fastening-type aluminum radiating fin assembly. The fastening-type aluminum radiating fin assembly is disposed on the top face of the aluminum base seat. A heat absorption end of the copper heat pipe is receiving in a channel formed on the bottom face of the aluminum base seat. A heat dissipation end of the copper heat pipe passes through and connects with the fastening-type aluminum radiating fin assembly. Finally, the copper plate is cooperatively overlaid on the bottom face of the aluminum base seat for contacting the heat source.

The aluminum surface of the aluminum base seat is easy to oxidize to produce an oxide ($AlO_3$) of high melting point in the welding process. The oxide ($AlO_3$) will directly hinder the aluminum material from being fused with copper metal. Therefore, it is difficult to weld the aluminum material with the copper material. In the case that the copper material is directly welded with the aluminum material, after welded, the directly welded sections of the two materials of copper and aluminum are apt to fissure due to great fragility. In addition, when the copper material is fused and welded with the aluminum material, eutectic structures such as $CuAl_2$ are quite easy to form in the welding seam near the copper material side. In addition, the eutectic structures of $CuAl_2$, etc. are distributed around the grain boundaries and easy to cause the problem of fatigue or fissure between the grain boundaries. Moreover, the melting points and eutectic temperatures of copper metal and aluminum metal are greatly different from each other. Therefore, in the fusion and welding operation, when the surface of aluminum metal is fully molten, the copper metal is still in solid state. Reversely, when the copper metal is molten, too much aluminum metal has been molten so that they cannot coexist in a co-fused or eutectic state. This greatly increases difficulty in welding of copper metal and aluminum metal. Furthermore, pores are easy to produce at the welding seam. This is because the copper and aluminum both have very good heat conductivity. When welded, the metal in the molten pool will quickly crystallize. As a result, the metallurgy reaction gas at high temperature cannot escape in time so that pores are easy to produce. Due to the above factors, the contact face of the aluminum base seat can be hardly directly welded with the copper heat pipe and/or copper plate.

In order to solve the above problem and other problems derived from the above problem that the aluminum metal and the copper metal cannot be directly welded with each other, the manufacturers employ such a method that the surface of the aluminum base seat in connection with the copper heat pipe and/or copper plate is surface-treated and modified to facilitate the welding of the heterogeneous metal materials. That is, it is necessary to previously form a chemical nickel coating on the bottom face and inner face of the channel or the corresponding connection/contact face of the aluminum base seat. Via the chemical nickel coating, the heterogeneous metal materials (aluminum and copper) are welded with each other. Currently, those who are skilled in this field employ electroless nickel plating as a technique for modifying the surface of the metal material. The electroless nickel plating provides a unique deposit property including uniformity of the deposit in the deep depression, perforation and blind hole. The electroless nickel plating is also termed "chemical deposition" or "autocatalytic plating". According to the content of phosphorus, the electroless nickel plating can be classified into three types: low phosphorus, middle phosphorus and high phosphorus. The electroless nickel plating is most different from the electroplating in that the electroless nickel plating is performed in a working environment without current. The metal irons are reduced by means of the reducing agent in the solution and the surface of the test piece must be catalyzed prior to electroless nickel plating.

The above method can solve the welding problem of the aluminum base seat and the copper heat pipe and the copper plate. However, the above method leads to environmental protection problem and other problems. This is because it is necessary to use a great amount of chemical reaction liquid in the electroless nickel plating process. In addition, after the electroless nickel plating process, a great amount of industrial waste liquid containing heavy metal or chemical material will be produced. Such industrial waste liquid will produce a great amount of waste water containing toxic material such as yellow phosphorus. The yellow phosphorus waste water contains yellow phosphorus of a concentration ranging from 50 mg/L to 390 mg/L. Yellow phosphorus is a hypertoxic material and is greatly harmful to the organs of human body, such as the liver. After a long period of drinking water containing yellow phosphorus, a human will suffer from the lesions of osteoporosis, necrosis of mandibular bone, etc. Therefore, currently, due to awareness of environmental protection, all countries have started to prohibit electroless nickel plating and relevant manufacturing processes and strenuously promoted non-toxic manufacturing process so as to protect the environment. Also, currently, the global supply chain of nickel and phosphorus materials used in the electroless nickel plating process is unstable and seriously short of nickel and phosphorus materials. This also leads to increase of the cost as a whole.

It is therefore tried by the applicant to provide a heat dissipation device assembly, in which the two heterogeneous metal materials can be still welded and connected with each other without surface modification treatment.

SUMMARY OF THE INVENTION

It is therefore a primary object of the present invention to provide a heat dissipation device assembly including an aluminum base seat. A copper embedding layer is disposed on the aluminum base seat. By means of the copper embedding layer, the aluminum base seat can be directly welded with a copper heat pipe made of heterogeneous metal material without surface modification. Therefore, the cost is effectively lowered and the object of environmental protection is achieved.

It is a further object of the present invention to provide a heat dissipation device assembly including an aluminum base seat and an aluminum radiating fin assembly. Copper embedding layers are respectively disposed on a section of the aluminum base seat, which section is to be connected and a section of the aluminum radiating fin assembly, which section is to be connected. By means of the copper embedding layers, the heat conduction components made of heterogeneous metal materials can be directly welded with each other without surface modification. Therefore, the cost is effectively lowered and the object of environmental protection is achieved.

To achieve the above and other objects, the heat dissipation device assembly of the present invention includes: an aluminum base seat having an upper face and at least one connection section, a copper embedding layer being disposed on the connection section; at least one aluminum radiating fin assembly composed of multiple radiating fins fastened with each other, the aluminum radiating fin assembly being positioned above or connected on the aluminum base seat, each radiating fin being formed with at least one perforation passing through the radiating fin, each two adjacent radiating fins defining therebetween an airflow passage normal to or parallel to the upper face of the aluminum base seat; and at least one U-shaped copper heat pipe. The U-shaped copper heat pipe is upright arranged or horizontally arranged. The U-shaped copper heat pipe has a heat dissipation section passing through the perforations of the aluminum radiating fin assembly and a heat absorption section connected with the connection section of the aluminum base seat. The heat absorption section is connected with the copper embedding layer of the connection section.

The copper embedding layer is disposed on the sections of the aluminum base seat and/or the aluminum radiating fin assembly to be connected. Accordingly, the aluminum base seat can be directly welded and connected with the copper heat pipe and/or the copper heat conduction component made of heterogeneous metal materials and directly welded and connected with the aluminum radiating fin assembly made of the same material without chemical nickel treatment. Therefore, not only the cost is effectively lowered, but also the object of environmental protection is achieved.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 1A, 1B, 2A and 2B. The heat dissipation device assembly 1 of the present invention includes at least one aluminum radiating fin assembly 11, an aluminum base seat 12, at least one copper heat pipe 14 and at least one copper heat conduction component 16. The aluminum radiating fin assembly 11 is composed of multiple radiating fins 110 fastened with each other. Each radiating fin 110 has a first folded edge 1101 and a second folded edge 1102. The first and second folded edges 1101, 1102 of the radiating fin 110 protrude from the radiating fin 110 and are flush with the first and second folded edges 1101, 1102 of an adjacent radiating fin 110. Each of the first and second folded edges 1101, 1102 has a fastening section 1103. In this embodiment, the fastening section 1103 is, but not limited to, a raised/recessed mating structure. Alternatively, the fastening section 1103 can be any other connection means. The fastening sections 1103 of each two adjacent radiating fins 110 are fastened with each other (by means of latching or lap joint) so as to connect the radiating fins 110 into the fastening-type aluminum radiating fin assembly 11. Accordingly, the first folded edges 1101 of the radiating fins 110 together form a top face 112 of the aluminum radiating fin assembly 11, while the second folded edges 1102 together form a bottom face 111 of the aluminum radiating fin assembly 11.

Figure 1A:
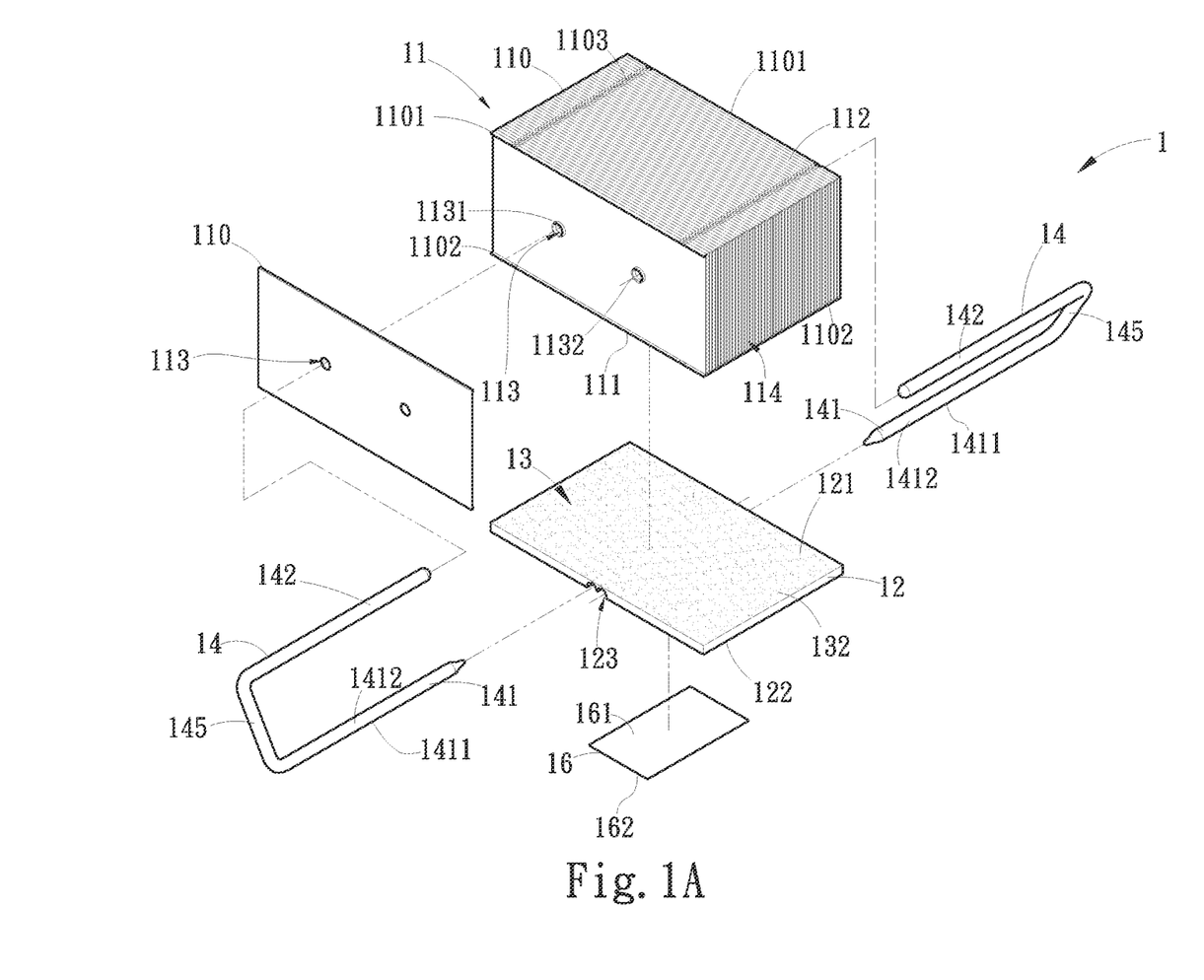
FIG. 1A is a perspective exploded view of the present invention.

Each radiating fin 110 is formed with at least one perforation 113 passing through the radiating fin 110. The perforations 113 are aligned with each other for a heat dissipation section 142 of the copper heat pipe 14 to pass through and connect therewith. Each perforation 113 has a hub 1131 annularly disposed on a rim of the perforation 113 and outward protruding from one side of the radiating fin 110 (from a front side of the radiating fin 110 in accordance with the drawing). The hub 1131 has a hub inner circumference 1132. In addition, the outermost radiating fin 110 of the aluminum radiating fin assembly 11 is reversely fastened so as to prevent the first and second folded edges 1101, 1102 from scraping other components or a user by mistake (as shown in FIG. 1A). Moreover, each two adjacent radiating fins 110 define therebetween an airflow passage 114, whereby an external airflow can pass through the airflow passage 114 to carry away the heat on the radiating fins 110. In practice, at least one fan (such as axial-flow fan) can be disposed on one side of the airflow passages 114 of the radiating fins 110 for producing external airflow to forcedly dissipate the heat of the radiating fins 110.

The aluminum base seat 12 has an upper face 121, a lower face 122 and at least one connection section 123. The upper face 121 of the aluminum radiating fin assembly 11 is, but not limited to, connected with the bottom face 111 of the aluminum radiating fin assembly 11. Alternatively, the aluminum radiating fin assembly 11 is correspondingly positioned above the upper face 121 of the aluminum base seat 12 and a heat dissipation gap is formed between the aluminum radiating fin assembly 11 and the aluminum base seat 12. The airflow passage 114 of the aluminum radiating fin assembly 11 is normal to the upper face 121 of the aluminum base seat 12. The connection section 123 is a channel or a through hole selectively positioned on the upper face 121 or on the lower face 122 or between the upper and lower faces 121, 122. In this embodiment, the connection section 123 is, but not limited to, a channel disposed on the lower face 122 of the aluminum base seat 12 for illustration. Alternatively, the connection section 123 can be a through hole passing through the aluminum base seat 12 between the upper and lower faces 121, 122. The connection section 123 is for connecting with a corresponding heat absorption section 141 of the copper heat pipe 14. In practice, the connection section 123 has a configuration in adaptation to the configuration of the heat absorption section 141 of the copper heat pipe 14, such as flat shape or circular shape or D shape.

Figure 2A:
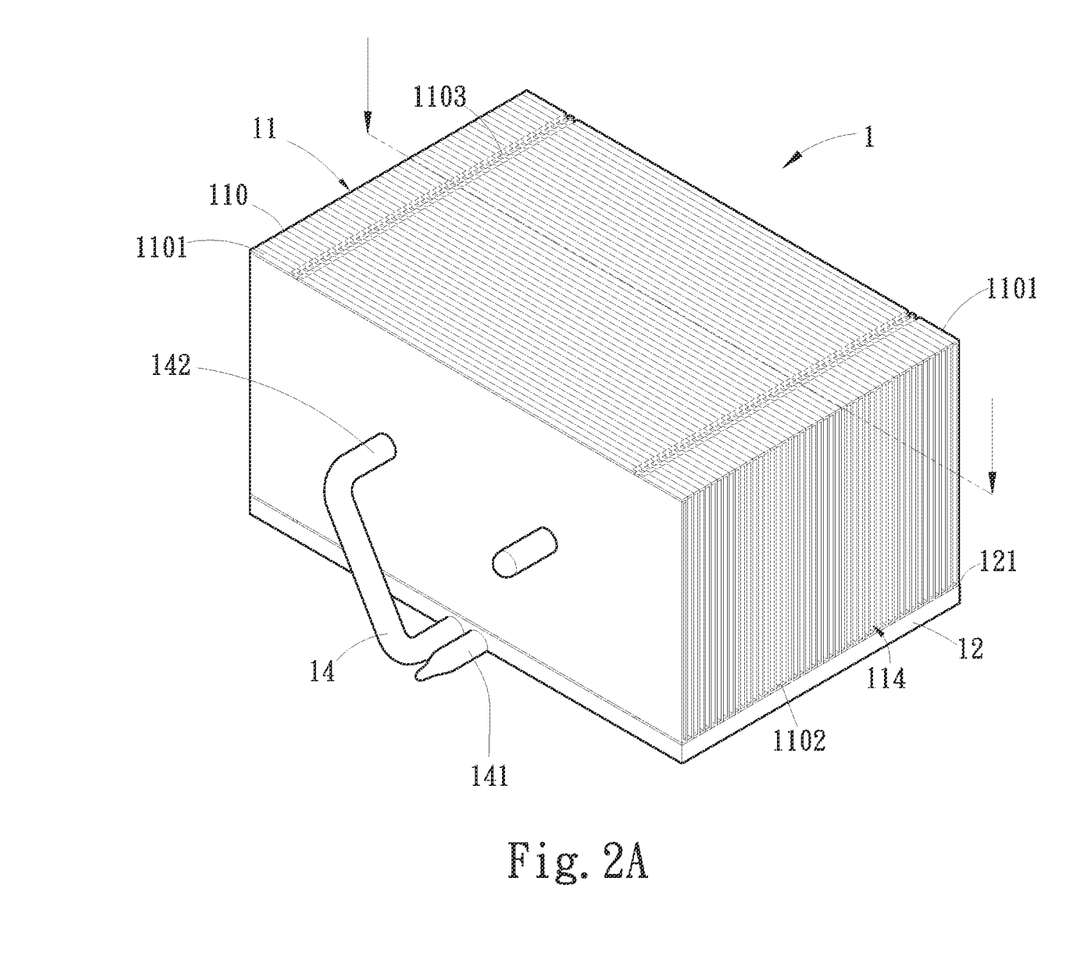
FIG. 2A is a perspective assembled view of the present invention.
Figure 2B:
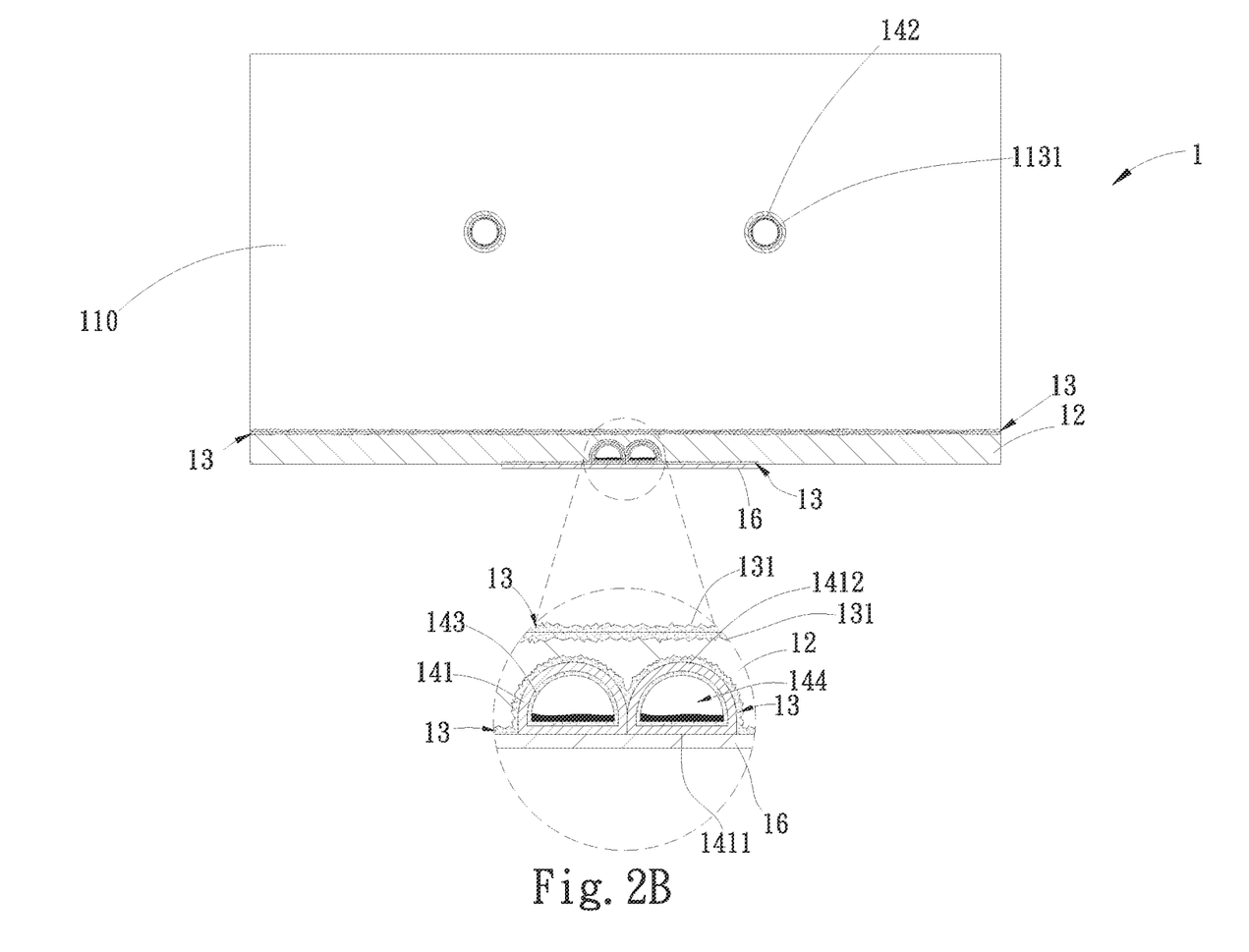
FIG. 2B is a sectional view of the present invention according to FIG. 2A.

Please further refer to FIGS. 1A and 2B. A copper embedding layer 13 is, but not limited to, disposed on each of the upper face 121, the lower face 122 and the connection section 123 of the aluminum base seat 12 and the bottom face 111 of the aluminum radiating fin assembly 11. Alternatively, the copper embedding layer 13 is simply disposed on the connection section 123 and/or the lower face 122 of the aluminum base seat 12.

The copper embedding layer 13 has an embedding face 131 and a contact surface 132. The contact surface 132 serves as an exposed surface of the copper embedding layer 13 and is connected with the bottom face 111 of the aluminum radiating fin assembly 11 and the upper and lower faces 121, 122 and the connection section 123 of the aluminum base seat 12. The embedding face 131 is embedded in the bottom face 111 of the aluminum radiating fin assembly 11 and the upper and lower faces 121, 122 and the connection section 123 of the aluminum base seat 12. The copper embedding layer 13 is selected from a group consisting of copper powder, copper foil, copper sheet and liquid copper. The copper embedding layer 13 is connected and formed on the bottom face 111 of the aluminum radiating fin assembly 11 and the upper and lower faces 121, 122 and the connection section 123 of the aluminum base seat 12 by means of mechanical processing (such as pneumatic pressing, hydraulic pressing, punching, oil pressing or extrusion) or surface treatment (such as spraying or printing) or chemical processing (such as electroplating or anode treatment). In the connection and forming procedure, a part of the copper embedding layer 13 is directly engaged or inlaid or deeply embedded in the bottom face 111 of the aluminum radiating fin assembly 11 and the upper and lower faces 121, 122 and the connection section 123 of the aluminum base seat 12 and deposited to form the embedding face 131. Accordingly, not only the copper embedding layer 13 is connected on the bottom face 111 and the upper and lower faces 121, 122 and the connection section 123, but also the embedding face 131 is engaged or inlaid or deeply embedded in the bottom face 111 and the upper and lower faces 121, 122 and the connection section 123 and deposited as a base of the copper embedding layer 13 so as to enhance the connection force (connection strength) of the copper embedding layer 13 so as to prevent the copper embedding layer 13 from being peeled (detached) from the bottom face 111 of the aluminum radiating fin assembly 11 and the upper and lower faces 121, 122 and the connection section 123 of the aluminum base seat 12. By means of the above arrangement, the upper and lower faces 121, 122 of the aluminum base seat 12 can be respectively connected with the bottom face 111 of the aluminum radiating fin assembly 11 and the copper heat conduction component 16 via the copper embedding layer 13. The heat absorption section 141 of the copper heat pipe 14 is connected with the copper embedding layer 13 of the connection section 123 of the aluminum base seat 12 (by means of such as welding).

In addition, the copper heat pipe 14 is U-shaped and can be upright arranged or horizontally arranged. The copper heat pipe 14 and the aluminum base seat 12 and the aluminum radiating fin assembly 11 are made of heterogeneous metal materials. In this embodiment, the copper heat pipe 14 is U-shaped and horizontally arranged for illustration. Each copper heat pipe 14 has a heat pipe chamber 144, in which a working fluid (such as pure water) is filled. A capillary structure 143 (such as sintered powder body, channel, mesh body, fiber, braid body or any combination thereof) is disposed on inner wall of the heat pipe chamber 144.

The copper heat pipe 14 has the heat absorption section 141, at least one heat dissipation section 142 and a middle section connected between the heat absorption section 141 and the heat dissipation section 142. The heat dissipation section 142 passes through the perforations 113 of the aluminum radiating fin assembly 11 and is positioned above the upper face 121 of the aluminum base seat 12. The heat absorption section 141 is connected with the connection section 123 of the aluminum base seat 12. The heat absorption section 141 serves to absorb the heat of the heat source and conduct the heat to the heat dissipation section 142 at remote end. Then the aluminum radiating fin assembly 11 dissipates the heat to outer side. The heat absorption section 141 has a heat pipe contact face 1411 and a heat pipe connection face 1412. The heat pipe contact face 1411 of the heat absorption section 141 is flush with the lower face 122 of the aluminum base seat 12. The heat pipe connection face 1412 of the heat absorption section 141 is welded and connected with the copper embedding layer 13 of the connection section 123. The heat dissipation section 142 passes through the perforations 113 of the radiating fins 110 and is, but not limited to, connected with the hub inner circumferences 1132 of the hubs 1131 by press fit. In a modified embodiment, the heat dissipation section 142 of the copper heat pipe 14 is loosely fitted in the perforations 113 and connected with the hubs 1131 of the perforations 113. The copper embedding layer 13 is disposed on the hub inner circumferences 1132 and connected with the heat dissipation section 142 of the copper heat pipe 14 (by means of such as welding).

In another modified embodiment of the copper heat pipe 14, the copper heat pipe 14 is U-shaped and upright arranged. The middle section 145 of the copper heat pipe 14 serves as the heat absorption section 141 and is connected on the connection section 123 of the aluminum base seat 12. The front end and the rear end of the copper heat pipe 14 respectively serve as the heat dissipation section 142 and are normal to the aluminum base seat 12. The front end and the rear end of the copper heat pipe 14 pass through the aluminum radiating fin assembly 11. The multiple radiating fins 110 are normal to the heat dissipation section 142 of the copper heat pipe 14. The airflow passages 114 between the radiating fins 110 are in parallel to the upper face 121 of the aluminum base seat 12.

Furthermore, as shown in the drawings, the heat dissipation section 142 of the copper heat pipe 14 has a circular cross section and the heat pipe contact face 1411 of the heat absorption section 141 is a plane face flush with the lower face 122 of the aluminum base seat 12, whereby the heat absorption section 141 has a D-shaped (or flat) cross section. However, the configurations of the heat absorption section 141 and the heat dissipation section 142 are not limited to the above configurations. In a modified embodiment, the cross sections of the absorption section 141 and the heat dissipation section 142 can have the same configuration such as circular shape, flat shape or D shape.

Figure 1B:
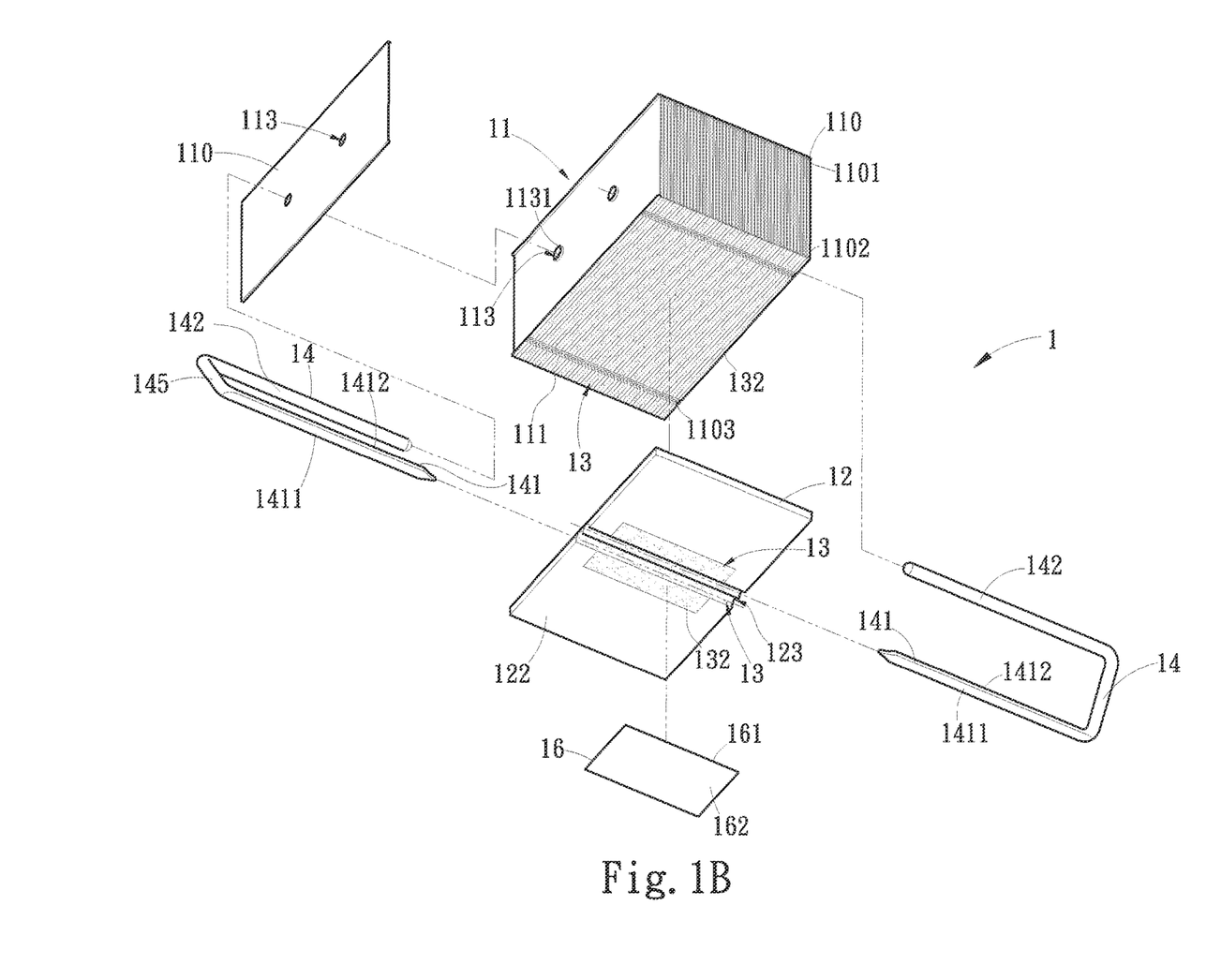
FIG. 1B is a perspective exploded view of the present invention, seen by another angle.

Please further refer to FIGS. 1B and 2B. The copper heat conduction component 16 is a copper plate body (such as copper substrate). In this embodiment, the copper heat conduction component 16 and the aluminum base seat 12 are made of heterogeneous metal materials, while the copper heat conduction component 16 and the copper heat pipe 14 are made of the same metal material. The copper heat conduction component 16 has a heat conduction face 161 and a heat absorption face 162. The heat conduction face 161 is respectively connected with the copper embedding layer 13 of the lower face 122 of the aluminum base seat 12 and the heat pipe contact face 1411 of the copper heat pipe 14 (by means of such welding).

The heat absorption face 162 of the copper heat conduction component 16 is attached to a heat generation component (such as a central processing unit or a graphics processing unit, not shown). The heat absorption face 162 serves to absorb the heat generated by the heat generation component and conduct the heat to the heat conduction face 161. Then the heat pipe contact face 1411 of the heat absorption section 141 of the copper heat pipe 14 absorbs the heat of the heat conduction face 161 and conducts the heat to the heat dissipation section 141 at remote end. Then the aluminum radiating fin assembly 11 dissipates the heat of the heat dissipation section 142 to outer side.

Also, part of the heat of the heat conduction face 161 is absorbed by the copper embedding layer 13 of the lower face 122 of the aluminum base seat 12 and dissipated to outer side via the aluminum base seat 12 by means of heat exchange.

Therefore, in the present invention, the copper embedding layer 13 is disposed on the sections of the aluminum base seat 12 and/or the aluminum radiating fin assembly 11 to be connected. Accordingly, the aluminum base seat 12 can be directly welded and connected with the copper heat pipe 14 and/or the copper heat conduction component 16 and the aluminum radiating fin assembly 11 made of heterogeneous metal materials without chemical nickel treatment. Therefore, not only the cost is effectively lowered, but also the object of environmental protection is achieved. Moreover, the problem of lack in nickel and phosphorus material is solved.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation device assembly comprising:
an aluminum base seat having an upper face and at least one connection section, a copper embedding layer being disposed on the at least one connection section;
at least one aluminum radiating fin assembly composed of multiple radiating fins fastened with each other, the at least one aluminum radiating fin assembly being connected on the aluminum base seat, each radiating fin being formed with at least one perforation passing through the radiating fin, each two adjacent radiating fins defining therebetween an airflow passage normal to the upper face of the aluminum base seat; and
at least one U-shaped copper heat pipe, the at least one U-shaped copper heat pipe being horizontally arranged and having at least one heat dissipation section passing through the at least one perforations of the at least one aluminum radiating fin assembly and a heat absorption section disposed on the at least one connection section of the aluminum base seat, the heat absorption section being connected with the aluminum base seat via the copper embedding layer.

2. The heat dissipation device assembly as claimed in claim 1, wherein the aluminum base seat further has a lower face, the at least one connection section being a channel formed on the lower face of the aluminum base seat, the at least one aluminum radiating fin assembly having a bottom face corresponding to the upper face of the aluminum base seat.

3. The heat dissipation device assembly as claimed in claim 2, wherein the copper embedding layer is respectively disposed on the bottom face of the at least one aluminum radiating fin assembly and the upper face of the aluminum base seat, the bottom face of the at least one aluminum radiating fin assembly and the upper face of the aluminum base seat being connected with each other via the copper embedding layer.

4. The heat dissipation device assembly as claimed in claim 2, wherein the at least one connection section is disposed on the lower face of the aluminum base seat and the heat absorption section is connected with the copper embedding layer of the at least one connection section.

5. The heat dissipation device assembly as claimed in claim 2, further comprising a copper heat conduction component, the copper heat conduction component having a heat conduction face, the copper embedding layer being disposed on the lower face of the aluminum base seat and connected with the heat conduction face of the copper heat conduction component.

6. The heat dissipation device assembly as claimed in claim 3, wherein the copper embedding layer is connected and formed on the bottom face of the at least one aluminum radiating fin assembly and the upper face of the aluminum base seat and the at least one connection section by means of mechanical processing, surface treatment procedure or chemical processing.

7. The heat dissipation device assembly as claimed in claim 3, wherein the copper embedding layer has an embedding face and a contact surface, the contact surface being connected on the bottom face of the at least one aluminum radiating fin assembly and the upper face of the aluminum base seat and the at least one connection section, while the embedding face is embedded in the bottom face of the at least one aluminum radiating fin assembly and the upper face of the aluminum base seat and the at least one connection section.

8. The heat dissipation device assembly as claimed in claim 1, wherein the at least one perforation of each radiating fin has a hub protruding outward from one side of the radiating fin, the hub having a hub inner circumference, the copper embedding layer being disposed on the hub inner circumference and connected with the heat dissipation section.

* * * * *